(12) United States Patent
Rokubuichi et al.

(10) Patent No.: US 11,784,105 B2
(45) Date of Patent: Oct. 10, 2023

(54) SEMICONDUCTOR DEVICE AND POWER CONVERTER

(71) Applicant: Mitsubishi Electric Corporation, Chiyoda-ku (JP)

(72) Inventors: Hodaka Rokubuichi, Chiyoda-ku (JP); Seiki Hiramatsu, Chiyoda-ku (JP); Shota Morisaki, Chiyoda-ku (JP); Shinya Yano, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 753 days.

(21) Appl. No.: 16/960,756

(22) PCT Filed: Dec. 3, 2018

(86) PCT No.: PCT/JP2018/044374
§ 371 (c)(1),
(2) Date: Jul. 8, 2020

(87) PCT Pub. No.: WO2019/171684
PCT Pub. Date: Sep. 12, 2019

(65) Prior Publication Data
US 2020/0335411 A1 Oct. 22, 2020

(30) Foreign Application Priority Data
Mar. 7, 2018 (JP) ................................. 2018-040577

(51) Int. Cl.
*H01L 23/31* (2006.01)
*H01L 23/495* (2006.01)
(Continued)

(52) U.S. Cl.
CPC .... *H01L 23/3135* (2013.01); *H01L 23/49524* (2013.01); *H01L 23/49811* (2013.01);
(Continued)

(58) Field of Classification Search
CPC ........... H01L 23/3135; H01L 23/49524; H01L 23/49811; H01L 24/24; H01L 25/072; H01L 25/18
(Continued)

(56) References Cited

U.S. PATENT DOCUMENTS 5,298,328 A 3/1994 Abe et al.
11,195,790 B2 * 12/2021 Kuroyanagi ........ H01L 23/5389
(Continued)

FOREIGN PATENT DOCUMENTS

JP 2015-53343 A 3/2015
JP 2015-70269 A 4/2015

OTHER PUBLICATIONS

International Search Report dated Feb. 12, 2019 in PCT/JP2018/044374 filed on Dec. 3, 2018.
(Continued)

*Primary Examiner* — Yemane Mehari
(74) *Attorney, Agent, or Firm* — XSENSUS LLP

(57) ABSTRACT

A semiconductor device includes: a circuit member including a planar portion; a terminal portion formed above the front surface of the planar portion of the circuit member and parallel to the planar portion; a semiconductor element which has an upper surface located below an upper surface of the terminal portion and is formed on the front surface of the planar portion of the circuit member; a resin layer arranged on the semiconductor element and having first openings through which the semiconductor element is exposed; a conductive layer arranged on the resin layer, including an upper surface located above the upper surface of the terminal portion, and joined to the semiconductor element through the first openings; and a sealing member including an upper surface parallel to the planar portion and integrally sealing the circuit member, the semiconductor
(Continued)

element, the resin layer, the conductive layer, and part of the terminal portion.

14 Claims, 6 Drawing Sheets

(51) Int. Cl.
  *H01L 23/498* (2006.01)
  *H01L 23/00* (2006.01)
  *H01L 25/07* (2006.01)
  *H01L 25/18* (2023.01)
  *H02M 7/5387* (2007.01)
  *H01L 23/29* (2006.01)
  *H02P 27/08* (2006.01)

(52) U.S. Cl.
  CPC ............ *H01L 24/24* (2013.01); *H01L 25/072* (2013.01); *H01L 25/18* (2013.01); *H02M 7/53871* (2013.01); *H01L 23/295* (2013.01); *H01L 2224/24137* (2013.01); *H01L 2224/24227* (2013.01); *H01L 2224/24247* (2013.01); *H02P 27/08* (2013.01)

(58) Field of Classification Search
  USPC .......................................................... 363/123
  See application file for complete search history.

(56) References Cited

U.S. PATENT DOCUMENTS

| 2015/0084207 | A1* | 3/2015 | Chauhan ............. H01L 23/5386 438/118 |
| 2015/0130076 | A1* | 5/2015 | Hino ....................... H01L 24/33 257/774 |
| 2016/0225690 | A1* | 8/2016 | Kadoguchi ....... H01L 23/49562 |

OTHER PUBLICATIONS

Office Action dated Aug. 25, 2022, in corresponding German patent Application No. 112018007231.2, 11 pages.

\* cited by examiner

SEMICONDUCTOR DEVICE AND POWER CONVERTER

TECHNICAL FIELD

The present invention relates to a semiconductor device in which an electrode and a conductive layer that are located on a semiconductor element are joined to each other with a resin layer therebetween, and to a power converter including the semiconductor device.

BACKGROUND ART

In a common semiconductor device, an electrode and any other portion located on a semiconductor element are wired by a bonding wire made of aluminum or the like and are then resin-sealed for insulation of a circuit. It is known that in a reliability test, a conventional semiconductor device including a bonding wire made of aluminum or the like as an interconnect has a shorter life due to breakage of the bonding wire or peeling at an interface between the semiconductor element and the bonding wire, which is one cause of degraded reliability of the semiconductor device.

For example, PTL 1 discloses a semiconductor device in which a semiconductor element and a bonding wire are connected by a solder on a metal plate for improved reliability of the semiconductor device. In this structure, however, only the emitter electrode of the semiconductor element is bonded with the metal plate, and the bonding wire is used for the gate electrode and the sensing electrode of the semiconductor element as in a conventional case. This increases the thickness of a sealing resin for sealing the bonding wire, leading to an increased distance from the front surface side of the semiconductor element to the outside of the sealing resin, which degrades heat dissipation properties.

In view of the above, a semiconductor device is desired that connects all electrodes using only the metal layer without using a bonding wire as an interconnect. As a measure to meet such a demand, for example, PTL 2 discloses a structure for wiring using power overlay (POL).

CITATION LIST

Patent Literature

PTL 1: Japanese Patent Laying-Open No. 2015-53343
PTL 2: Japanese Patent Laying-Open No. 2015-70269

SUMMARY OF INVENTION

Technical Problem

Although the metal layer is used for wiring with the semiconductor element in the conventional semiconductor device, vias are formed around the semiconductor element, and upper and lower portions are wired through the vias. This causes heat also around the semiconductor element, which may thermally affect the semiconductor element. Also, a terminal should be formed for electrical connection with the outside, and the terminal should be formed with a distance from the rear surface side of the semiconductor element for securing insulation properties when the terminal is taken out from the lateral surface of the semiconductor device. The terminal is arranged at a connectable position of the upper portion of the metal layer, and is entirely sealed with a sealing resin. Consequently, when the heat generated in the semiconductor element is dissipated to the outside also from the metal layer on the front surface side of the semiconductor element, the upper surface of the metal layer of the upper portion of the semiconductor element is positioned flush with or below the upper surface of the terminal. Such a position leads to an increased distance from the metal layer connected with the semiconductor element at low thermal resistance to the sealing resin, which may degrade the heat dissipation properties of the semiconductor device.

The present invention has been made to solve such a problem, and an object thereof is to implement a mold-type semiconductor device with high heat dissipation properties.

Solution to Problem

A semiconductor device includes: a circuit member including a front surface and a rear surface and including a planar portion; a terminal portion formed above the front surface of the planar portion of the circuit member and parallel to the planar portion; a semiconductor element including an upper surface located below an upper surface of the terminal portion, the semiconductor element being formed on the front surface of the planar portion of the circuit member; a resin layer arranged on the semiconductor element and having a plurality of first openings through which the semiconductor element is exposed; a conductive layer arranged on the resin layer, having an upper surface located above the upper surface of the terminal portion, and joined to the semiconductor element through the plurality of first openings; and a sealing member including an upper surface parallel to the planar portion and integrally sealing the circuit member, the semiconductor element, the resin layer, the conductive layer, and part of the terminal portion.

Advantageous Effects of Invention

In the semiconductor device of the present invention, the upper surface of the conductive layer is located above the upper surface of the terminal portion, and thus, a distance from the conductive layer to the filling member can be reduced, leading to improved heat dissipation properties of the semiconductor device.

DESCRIPTION OF EMBODIMENTS

A general configuration of a semiconductor device of the present invention will be described first with reference to the drawings. Note that the drawings are schematic representation and do not scale. The same reference sign refers to the same or corresponding part, which applies throughout this specification.

Embodiment 1

A semiconductor device in Embodiment 1 of the present invention will be described with reference to FIGS. 1 and 2.

Figure 1:
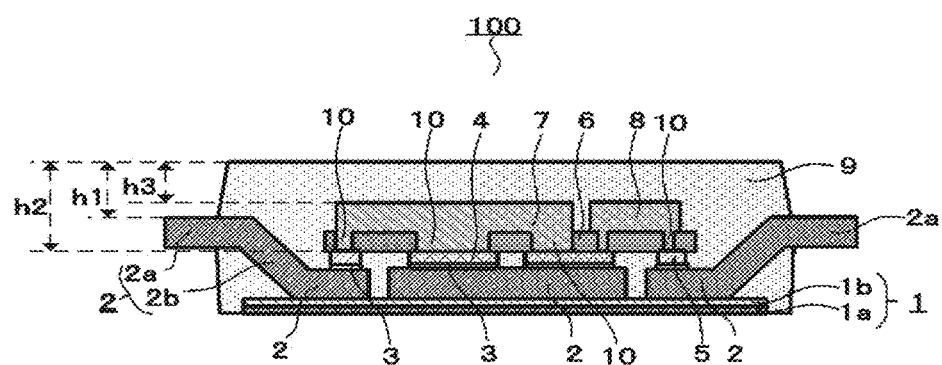
FIG. 1 is a schematic structural sectional view of a semiconductor device in Embodiment 1 of the present invention.
Figure 2:
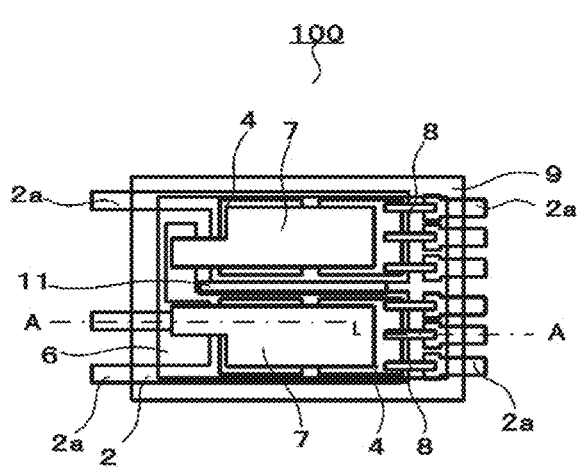
FIG. 2 is a schematic structural plan view of the semiconductor device in Embodiment 1 of the present invention.

FIG. 1 is a schematic structural sectional view of the semiconductor device in Embodiment 1 of the present invention. FIG. 2 is a schematic structural plan view of the semiconductor device in Embodiment 1 of the present invention. FIG. 1 is a schematic structural sectional view taken along a dot-dash line shown in FIG. 2.

With reference to FIG. 1, a semiconductor device 100 includes a thermally conductive member 1, a lead frame 2, which is a circuit member, a solder 3, which is a joining member, a semiconductor element 4, a conductive spacer 5, which is a connecting member, an insulating resin layer 6, which is a resin layer, a main-circuit conductive layer 7, which is a conductive layer (first conductive layer), a control conductive layer 8, which is a conductive layer (second conductive layer), and a sealing resin 9, which is a sealing member. A distance from the upper surface of a terminal portion 2a, which is a terminal portion of lead frame 2 inside sealing resin 9, to the upper surface of sealing resin 9 is represented by h1, a distance from the upper surface of semiconductor element 4 to the upper surface of sealing resin 9 is represented by h2, and a distance from the upper surfaces of main-circuit conductive layer 7 and control conductive layer 8 to the upper surface of sealing resin 9 is represented by h3. The upper surface of sealing resin 9 is parallel to and faces the upper surface of terminal portion 2a of lead frame 2 and the upper surface of semiconductor element 4.

Thermally conductive member 1 includes a metal foil 1a and an insulating sheet 1b formed on the upper surface of metal foil 1a. Thermally conductive member 1 is an insulating layer with high heat dissipation properties. Insulating sheet 1b functions to insulate metal foil 1a and lead frame 2 from each other and dissipate the heat generated in semiconductor element 4 to metal foil 1a through insulating sheet 1b. A highly thermally conductive member, such as a copper plate, an aluminum plate, or a copper foil, is used as metal foil 1a.

A thermosetting resin, such as epoxy resin, is used for insulating sheet 1b, and a highly conductive filler, such as silica, alumina, or boron nitride, is mixed into insulating sheet 1b.

Lead frame 2 having a predetermined interconnect structure (interconnect circuit) is provided on thermally conductive member 1. Lead frame 2 includes a front surface and a rear surface. The rear surface of lead frame 2 is arranged on insulating sheet 1b of thermally conductive member 1. A rear surface electrode of semiconductor element 4 is joined onto the interconnect circuit in the front surface of lead frame 2 with solder 3 serving as the joining member therebetween.

Lead frame 2 has, for example, an interconnect circuit having a planar portion formed of a flat plate-shaped copper plate having a thickness of approximately 0.6 mm through press molding. The interconnect circuit of lead frame 2 has terminal portion 2a and a stepped portion (inclined portion) 2b. Terminal portion 2a is connected through stepped portion 2b to the interconnect circuit of lead frame 2 on which semiconductor element 4 is arranged. Terminal portion 2a and stepped portion 2b of lead frame 2 are not in contact with thermally conductive member 1 because of the presence of stepped portion 2b. Thus, the portion between metal foil 1a of thermally conductive member 1 and terminal portion 2a and stepped portion 2b of lead frame 2 is a portion that sealing resin 9 comes in. Stepped portion 2b of lead frame 2 is a structure for restraining dielectric breakdown along an interface between metal foil 1a of thermally conductive member 1 and sealing resin 9. Terminal portion 2a is arranged inside sealing resin 9. Terminal portion 2a partially projects from inside to outside on the lateral surface side of sealing resin 9. Terminal portion 2a is formed above the front surface of the planar portion of lead frame 2.

Stepped portion 2b of lead frame 2 is formed by, for example, half blanking (half etching). The height of stepped portion 2b of lead frame 2 is, for example, 0.1 mm or more and 0.3 mm, which is a half of the thickness of lead frame 2, or less. As the height of stepped portion 2b of lead frame 2 is set to 0.1 mm or more, the generation of a void is restrained in sealing resin 9 that is filled between thermally conductive member 1 and lead frame 2.

As the height of stepped portion 2b of lead frame 2 is set to 0.3 mm, a half of the thickness of lead frame 2, or less, the strength of lead frame 2 can be secured. Moreover, as stepped portion 2b is provided and the space surrounding stepped portion 2b is filled with sealing resin 9, the withstand voltage between metal foil 1a of thermally conductive member 1 and lead frame 2 can be improved.

Herein, since stepped portion 2b is provided in lead frame 2, terminal portion 2a of lead frame 2 inside sealing resin 9 is arranged above the portion (region) of the front surface (upper surface) of lead frame 2 on which semiconductor element 4 is mounted. Semiconductor element 4 is arranged on the front surface of lead frame 2. The upper surface of semiconductor element 4 is arranged on the front surface side (lower side) of lead frame 2 relative to the upper surface of terminal portion 2a of lead frame 2. That is to say, the distance (h1) from the upper surface of terminal portion 2a of lead frame 2 inside sealing resin 9 to the upper surface of sealing resin 9 is less than the distance (h2) from the upper surface of semiconductor element 4 to the upper surface of sealing resin 9. Also, the upper surface of terminal portion 2a of lead frame 2 inside sealing resin 9 is arranged above the upper surface of semiconductor element 4. The upper surface of semiconductor element 4 is located below the upper surface of terminal portion 2a. Such an arrangement can improve the withstand voltage between metal foil 1a of thermally conductive member 1 and terminal portion 2a of lead frame 2 as described above.

Semiconductor element 4 is, for example, a diode used for a converter unit that converts supplied alternating current (AC) power to direct current (DC) power, a bipolar transistor used for an inverter unit that converts DC power to AC power, an insulated gate bipolar transistor (IGBT), a metal oxide semiconductor field effect transistor (MOSFET), or a gate turn-off thyristor (GTO).

Conductive spacer 5 is formed on the upper surface of lead frame 2, which is the same surface as the surface on which semiconductor element 4 is arranged (joined), and is electrically connected with semiconductor element 4 through main-circuit conductive layer 7 and control conductive layer 8. As conductive spacer 5, a metal plate of copper, aluminum, or the like is arranged at a predetermined position on the upper surface of lead frame 2 through solder 3 or the like. Conductive spacer 5 can also be formed by stacking solder 3 in place of the metal plate. For example, as a non-conductive plate is arranged through bonding with an adhesive at a position at which electrical connection is not required, conductive spacer 5 can also be used as a supporting member of insulating resin layer 6. The height of conductive spacer 5 is equal to the height of semiconductor element 4 in a range in which insulating resin layer 6 can be formed thereon.

For example, a polymer material such as liquid crystal polymer or polyimide is used for insulating resin layer 6. Insulating resin layer 6 is made of a single-layer resin film formed by spin coating, printing, or the like or a stack film including a stack of resin films. Insulating resin layer 6 has such a film thickness that allows electric insulation of semiconductor element 4 on the lower surface side of insulating resin layer 6 from main-circuit conductive layer 7 or control conductive layer 8 on the upper surface side of insulating resin layer 6. Alternatively, insulating resin layer 6 may have a portion with a different thickness which is produced by layering (stacking) resin films at a predetermined position of insulating resin layer 6 at which a withstand voltage is required.

Insulating resin layer 6 is in the form of a sheet and is arranged continuously (across) the upper surfaces of semiconductor elements 4. Also, insulating resin layer 6 is arranged continuously on the upper surface of semiconductor element 4 and the upper surface of conductive spacer 5. Insulating resin layer 6 has openings 10, which are first openings and through which semiconductor element 4 and conductive spacer 5 are electrically connected with main-circuit conductive layer 7 and control conductive layer 8, respectively. Openings 10 are connected with semiconductor element 4 and conductive spacer 5 at different opening positions. Main-circuit conductive layer 7 and control conductive layer 8 are wired through openings 10 of insulating resin layer 6 by, for example, filling openings 10 by the method such as plating in which copper is used as a material and then stacking these layers on the upper surface of insulating resin layer 6. Insulating resin layer 6 may have a plurality of openings 10 formed in accordance with a circuit configuration. Openings 10 may have a plurality of sizes depending on a purpose.

Insulating resin layer 6 also has an opening 11, which is a second opening. In plan view, a region (a portion which is not in contact with any of semiconductor element 4 or conductive spacer 5) other than a region on the front surface of lead frame 2 in which semiconductor element 4 or conductive spacer 5 is arranged is provided at least partially around opening 11 (see FIGS. 2, 7, 8). Opening 11 includes a narrow gap formed, for example, between semiconductor elements 4 or between conductive spacer 5 or semiconductor element 4 and conductive spacer 5. In sealing through filling of sealing resin 9, sealing resin 9 fills the space between semiconductor elements 4 or between conductive spacers 5, between which the narrow gap is included, through opening 11. Consequently, sealing resin 9 is filled on the lower surface side of insulating resin layer 6.

Main-circuit conductive layer 7 is joined to, for example, the source electrode or the emitter electrode which is the main electrode of semiconductor element 4. Control conductive layer 8 is joined to, for example, the gate electrode or the sensing electrode which is the control electrode of semiconductor element 4. In the present embodiment, main-circuit conductive layer 7 and control conductive layer 8 are identical to each other in the position in the thickness direction (have the same thickness), meaning that a period of time for stacking a conductive layer through plating or the like is the same. Further, in the case where semiconductor element 4 is a diode, for example, there is no control electrode, and thus, only main-circuit conductive layer 7 is joined to the main electrode of the diode. In the case where a plurality of semiconductor elements 4 are used, main-circuit conductive layer 7 connects semiconductor elements 4 to each other or connects semiconductor element 4 and conductive spacer 5 to each other. Control conductive layer 8 connects the control electrode of semiconductor element 4 and conductive spacer 5 to each other.

Each of main-circuit conductive layer 7 and control conductive layer 8 has a thickness larger than or equal to the thickness of insulating resin layer 6. When each of main-circuit conductive layer 7 and control conductive layer 8 has a thickness smaller than the thickness of insulating resin layer 6, in opening 10, each conductive layer cannot fill opening 10 and may not function as a current path due to an increased resistance value as the conductive layer. Further, heat is generated excessively due to an increased resistance, and accordingly, the generated heat cannot be dissipated efficiently to the outside of sealing resin 9, degrading heat dissipation properties. However, opening 10 can be filled by making the thicknesses of main-circuit conductive layer 7 and control conductive layer 8 larger than the thickness of insulating resin layer 6, so that main-circuit conductive layer 7 and control conductive layer 8 can be formed on insulating resin layer 6. Also, the resistance values of main-circuit conductive layer 7 and control conductive layer 8 can be reduced by making the thicknesses of main-circuit conductive layer 7 and control conductive layer 8 larger than the thickness of insulating resin layer 6, so that thermal capacities of main-circuit conductive layer 7 and control conductive layer 8 increase as well, allowing collection of a larger amount of heat generated in semiconductor element 4 or the like. Then, cooling efficiency can be enhanced through conduction of heat to the upper portion of sealing resin 9 through main-circuit conductive layer 7 and control conductive layer 8.

The distance (h3) from the upper surfaces of main-circuit conductive layer 7 and control conductive layer 8 to the upper surface of sealing resin 9 is equal to or less than the distance (h1) from the upper surface of terminal portion 2a of lead frame 2 inside sealing resin 9 to the upper surface of sealing resin 9. In other words, the upper surfaces of main-circuit conductive layer 7 and control conductive layer 8 are arranged on the upper surface side of sealing resin 9 relative to the upper surface of terminal portion 2a of lead frame 2 inside sealing resin 9. The upper surfaces of main-circuit conductive layer 7 and control conductive layer 8 are located above the upper surface of terminal portion 2a. On the lower surface side of semiconductor element 4, the heat generated from semiconductor element 4 or the like is mainly conducted from lead frame 2 to thermally conductive member 1 on the rear surface side of lead frame 2 and then dissipated to the outside on the lower surface side of sealing resin 9. It is conceivable that on the upper surface side of semiconductor element 4, heat may be dissipated from the upper surfaces of main-circuit conductive layer 7 and control conductive layer 8 which are joined to the upper surface of semiconductor element 4 through sealing resin 9 to the outside from the upper surface of sealing resin 9.

When the semiconductor device has the same external dimensions and the upper surfaces of main-circuit conductive layer 7 and control conductive layer 8 are located on the side (lower side) of lead frame 2 on which semiconductor element 4 is arranged relative to the upper surface of terminal portion 2a of lead frame 2, main-circuit conductive layer 7 and control conductive layer 8 each have a smaller thickness. This leads to a larger distance from main-circuit conductive layer 7 and control conductive layer 8 to the upper surface of sealing resin 9. Thus, a Joule heat generated as current flows through main-circuit conductive layer 7 and control conductive layer 8 and a heat generated in semiconductor element 4 are conducted together to main-circuit conductive layer 7 and control conductive layer 8. However, heat is not dissipated efficiently from the upper surface side of semiconductor element 4 to the outside of sealing resin 9 due to a large distance from the upper surface side of main-circuit conductive layer 7 and control conductive layer 8 to the outside of sealing resin 9. Thus, the heat is then conducted to lead frame 2, and subsequently, is mostly dissipated from thermally conductive member 1 on the rear surface side of lead frame 2 to the outside of sealing resin 9. This causes concentration of the heat on thermally conductive member 1, degrading the heat dissipation properties of the semiconductor device.

In semiconductor device 100 of Embodiment 1, however, the upper surfaces of main-circuit conductive layer 7 and control conductive layer 8 are arranged above the upper surface of terminal portion 2a of lead frame 2 inside sealing resin 9 (on the upper surface side of sealing resin 9). Consequently, the thickness of sealing resin 9 on main-circuit conductive layer 7 and control conductive layer 8 can be made thinner. This can reduce a distance from the upper surfaces of main-circuit conductive layer 7 and control conductive layer 8 to the upper surface (outside) of sealing resin 9, mainly causing the upper surface sides of main-circuit conductive layer 7 and control conductive layer 8 to be in charge of part of the heat which is conducted through lead frame 2 and dissipated from thermally conductive member 1 on the rear surface side of lead frame 2 to the outside, enabling heat dissipation. Consequently, the heat generated on the upper surface side of semiconductor element 4 can be efficiently conducted to the outside of sealing resin 9 to be dissipated, leading to enhanced cooling efficiency. Also, heat dissipation properties can be improved with the size of semiconductor device 100 maintained. This can improve the reliability of semiconductor device 100. In particular, in usage conditions that require an operation at high temperature, heat dissipation at a plurality of spots is effective.

Sealing resin 9 secures insulation properties between sealed members and also functions as a case of semiconductor device 100. Sealing resin 9 integrally seals lead frame 2, semiconductor element 4, conductive spacer 5, insulating resin layer 6, and conductive layers 7 and 8. In sealing resin 9, the front surface side of lead frame 2 on which semiconductor element 4 is arranged is the upper surface side, and the rear surface of lead frame 2 on which semiconductor element 4 is not arranged is the lower surface side. For example, transfer molding, injection molding, compression molding, or any other molding can be used as the method of molding sealing resin 9. The material for sealing resin 9 may be, for example, an epoxy resin containing a filling material, a phenolic resin, or any other resin.

Next, a method of manufacturing semiconductor device 100 of Embodiment 1 which is configured as described above will be described.

FIGS. 3 to 9 are schematic structural plan views showing the steps of manufacturing the semiconductor device in Embodiment 1 of the present invention. Semiconductor device 100 shown in FIG. 2 can be manufactured through a resin sealing step performed after the steps of FIGS. 3, 5, and 6.

Figure 3:
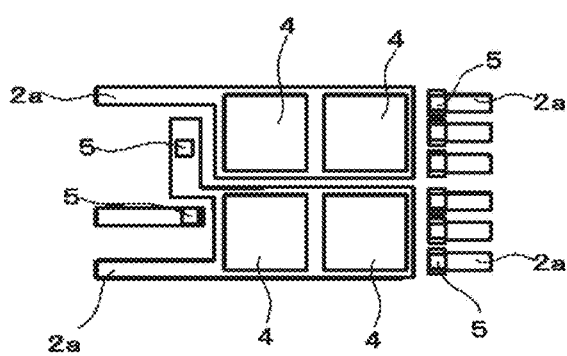
FIG. 3 is a schematic structural plan view of the semiconductor device in Embodiment 1 of the present invention before formation of an insulating resin layer.
Figure 4:
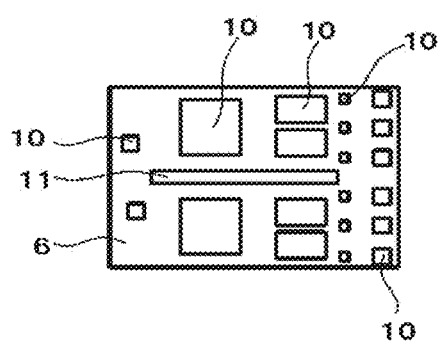
FIG. 4 is a schematic structural plan view of the insulating resin layer of the semiconductor device in Embodiment 1 of the present invention.
Figure 5:
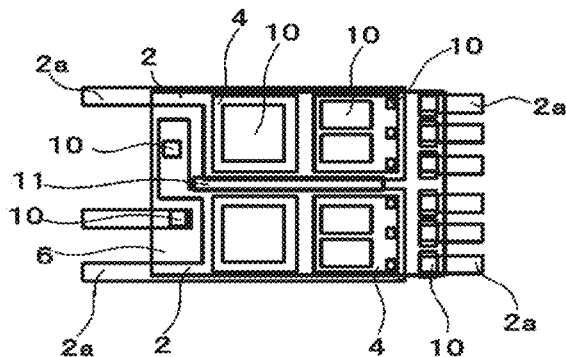
FIG. 5 is a schematic structural plan view of the semiconductor device in Embodiment 1 of the present invention after formation of the insulating resin layer.
Figure 6:
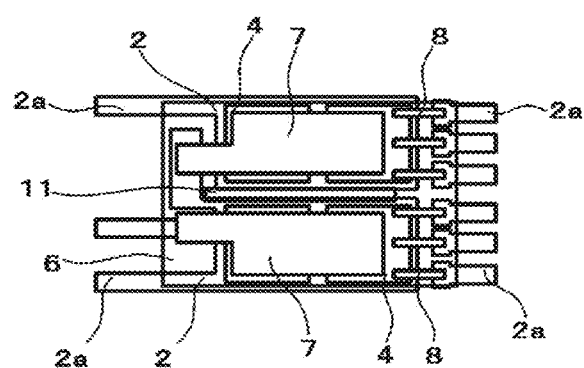
FIG. 6 is a schematic structural plan view of the semiconductor device in Embodiment 1 of the present invention after formation of a conductive layer.
Figure 7:
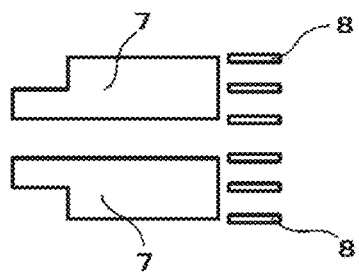
FIG. 7 is a schematic structural plan view of the conductive layer of the semiconductor device in Embodiment 1 of the present invention.

FIG. 3 is a schematic structural plan view of the semiconductor device in Embodiment 1 of the present invention before the formation of an insulating resin layer. FIG. 4 is a schematic structural plan view of the insulating resin layer of the semiconductor device in Embodiment 1 of the present invention. FIG. 5 is a schematic structural plan view of the semiconductor device in Embodiment 1 of the present invention after the formation of the insulating resin layer. FIG. 6 is a schematic structural plan view of the semiconductor device in Embodiment 1 of the present invention after the formation of a conductive layer. FIG. 7 is a schematic structural plan view of the conductive layer of the semiconductor device in Embodiment 1 of the present invention.

First, semiconductor element 4 and conductive spacer 5 are joined at predetermined positions on the front surface of lead frame 2 with solder 3 therebetween as shown in FIG. 3 (member arranging step).

Subsequently, insulating resin layer 6 is formed on semiconductor element 4 and conductive spacer 5 joined to the front surface of lead frame 2 as shown in FIG. 5 (insulating resin layer forming step). Openings 10 are formed in advance in insulating resin layer 6 at the positions that are located above semiconductor element 4 and conductive spacer 5. Openings 10 are provided at a plurality of spots in insulating resin layer 6 and each have a shape connectable with main-circuit conductive layer 7 and control conductive layer 8 in a subsequent step in accordance with the electrode shape of semiconductor element 4 or the shape of conductive spacer 5.

Subsequently, main-circuit conductive layer 7 and control conductive layer 8 are arranged on the upper surface of insulating resin layer 6 as shown in FIG. 6 (conductive layer forming step). At this time, semiconductor element 4 and conductive spacer 5 are electrically connected to main-circuit conductive layer 7 and conductive layer 8, respectively, through openings 10 formed in insulating resin layer 6. Main-circuit conductive layer 7 and control conductive layer 8 have the structure shown in FIG. 2 which is obtained by stack of, for example, metallic components such as copper through soldering and connection with semiconductor element 4 and conductive spacer 5.

Although FIG. 7 shows an example schematic plan view of main-circuit conductive layer 7 and control conductive layer 8, it suffices that main-circuit conductive layer 7 and control conductive layer 8 have the shape of a conductive layer adapted to an interconnect circuit formed in the front surface of lead frame 2.

Subsequently, lead frame 2 subjected to the above steps is sealed with sealing resin 9 (resin sealing step). In the resin sealing step, thermally conductive member 1 and lead frame 2 produced through the above steps are placed in a die as shown in FIG. 1. After the placing into the die, sealing resin 9 is molded (fills) through transfer molding, compression molding, injection molding, or any other molding. At this time, sealing resin 9 fills the space between lead frame 2 and insulating resin layer 6 through opening 11 provided in insulating resin layer 6. In the resin sealing step, insulating resin layer 6 does not soften with the heat in the resin sealing process and maintains the shape at the formation of insulating resin layer 6. That is to say, insulating resin layer 6 is formed of a material having a higher heat-resisting property than that of sealing resin 9.

Figure 8:
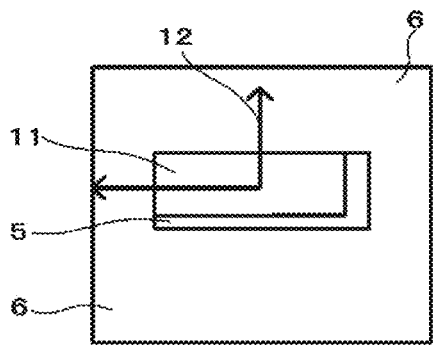
FIG. 8 is a schematic structural plan view of an opening and therearound of the semiconductor device in Embodiment 1 of the present invention.
Figure 9:
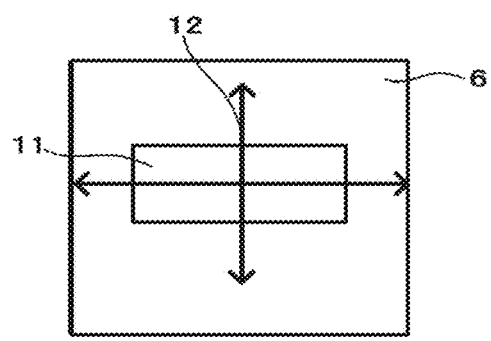
FIG. 9 is a schematic structural plan view of another opening and therearound of the semiconductor device in Embodiment 1 of the present invention.

FIG. 8 is a schematic structural plan view of an opening and therearound of the semiconductor device in Embodiment 1 of the present invention. FIG. 9 is a schematic structural plan view of another opening and therearound of the semiconductor device in Embodiment 1 of the present invention.

As shown in FIG. 8, when a portion that is in contact with conductive spacer 5 or the like is located around opening 11 which is the second opening of insulating resin layer 6, unlike when there is no such a portion as shown in FIG. 9, sealing resin 9 does not flow toward such a portion but flows in the direction free from such a portion, and accordingly, a flow direction 12 of sealing resin 9 can be appropriately controlled depending on the position at which opening 11 is formed. After sealing resin 9 is molded, opening 11 is filled with sealing resin 9.

Semiconductor device 100 configured as described above, in which the upper surfaces of main-circuit conductive layer 7 and control conductive layer 8 are located above the upper surface of terminal portion 2a of lead frame 2, can efficiently conduct the heat generated in semiconductor element 4 to the outside of sealing resin 9 also from the upper surface side of semiconductor element 4, leading to enhanced cooling efficiency. This can improve the reliability of semiconductor device 100.

Embodiment 2

Embodiment 2 differs from Embodiment 1 in that main-circuit conductive layer 7 used in Embodiment 1 has a thickness larger than the thickness of control conductive layer 8. Main-circuit conductive layer 7 joined to semiconductor element 4 is thicker than control conductive layer 8 as described above, enabling efficient dissipation of the heat from semiconductor element 4 that generates a large amount of heat. Embodiment 2 is similar to Embodiment 1 in the other respects, and accordingly, detailed description will be omitted.

Also in such a case, the upper surfaces of main-circuit conductive layer 7 and control conductive layer 8 are located above the upper surface of terminal portion 2a of lead frame 2, and accordingly, the heat generated in semiconductor element 4 can be efficiently conducted to the outside of sealing resin 9 also from the upper surface side of semiconductor element 4 to the outside of sealing resin 9, leading to enhanced cooling efficiency. This can improve the reliability of the semiconductor device.

Figure 10:
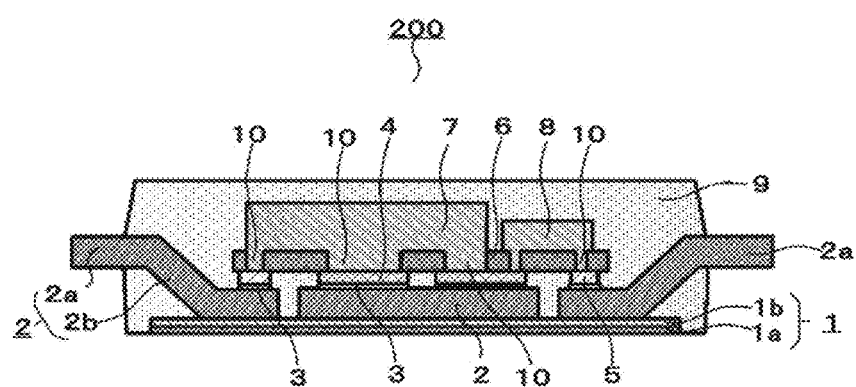
FIG. 10 is a schematic structural sectional view of a semiconductor device in Embodiment 2 of the present invention.

FIG. 10 is a schematic structural sectional view of a semiconductor device in Embodiment 2 of the present invention. With reference to FIG. 10, a semiconductor device 200 includes thermally conductive member 1, lead frame 2 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, and openings 10 that are first openings. Main-circuit conductive layer 7 has a thickness larger than the thickness of control conductive layer 8. Lead frame 2 has terminal portion 2a that is a terminal portion and stepped portion (inclined portion) 2b.

Main-circuit conductive layer 7 as shown in FIG. 10 can be formed by, for example, stacking main-circuit conductive layer 7 to be thick through plating or by bonding of a thick metal plate of copper through pressing. Consequently, main-circuit conductive layer 7 thicker than control conductive layer 8 can be achieved.

Semiconductor device 200 configured as described above, in which the upper surfaces of main-circuit conductive layer 7 and control conductive layer 8 are located above the upper surface of terminal portion 2a of lead frame 2, can conduct the heat generated in semiconductor element 4 to the outside of sealing resin 9 also from the upper surface side of semiconductor element 4, leading to enhanced cooling efficiency. This can improve the reliability of semiconductor device 200.

Main-circuit conductive layer 7 joined to semiconductor element 4 is thicker than control conductive layer 8 as described above, enabling efficient dissipation of the heat from semiconductor element 4 that generates a large amount of heat.

Embodiment 3

Embodiment 3 differs from Embodiment 2 in that the thickness of insulating resin layer 6 used in Embodiment 2 is larger on the outer circumferential portion of semiconductor element 4 than outside of the outer circumferential portion of semiconductor element 4. Since insulating resin layer 6 has an increased thickness on the outer circumferential portion of semiconductor element 4, the insulating properties of the semiconductor device can be improved further. Embodiment 3 is similar to Embodiment 2 in the other respects, and accordingly, detailed description will be omitted.

Also in such a case, the upper surfaces of main-circuit conductive layer 7 and control conductive layer 8 are located above the upper surface of terminal portion 2a of lead frame 2, and accordingly, the heat generated in semiconductor element 4 can be efficiently conducted to the outside of sealing resin 9 also from the upper surface side of semiconductor element 4, leading to enhanced cooling efficiency. This can improve the reliability of the semiconductor device.

Figure 11:
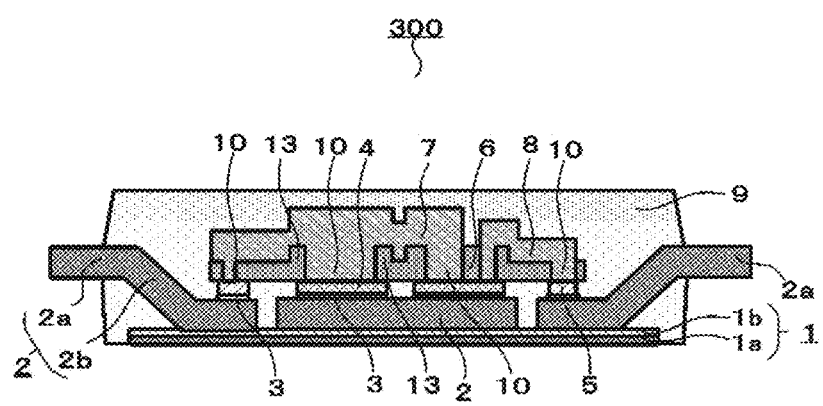
FIG. 11 is a schematic structural sectional view of a semiconductor device in Embodiment 3 of the present invention.
Figure 12:
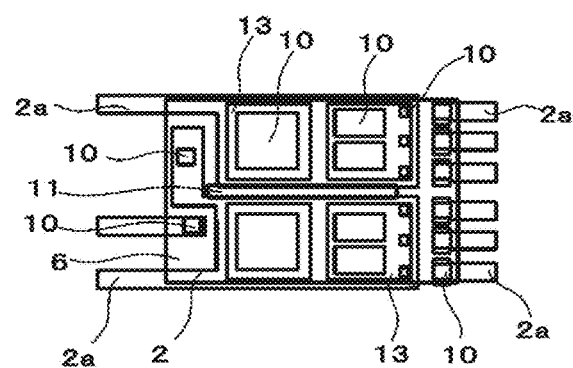
FIG. 12 is a schematic structural plan view of the semiconductor device in Embodiment 3 of the present invention.

FIG. 11 is a schematic structural sectional view of a semiconductor device in Embodiment 3 of the present invention. FIG. 12 is a schematic structural plan view of the semiconductor device in Embodiment 3 of the present invention. With reference to FIG. 11, a semiconductor device 300 includes thermally conductive member 1, lead frame 2 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, openings 10 that are first openings, and a projection 13 of insulating resin layer 6. Main-circuit conductive layer 7 has a thickness larger than the thickness of control conductive layer 8. Projection 13 of insulating resin layer 6 is formed in the outer circumferential portion of semiconductor element 4. Projection 13 of insulating resin layer 6 has a thickness larger than the thickness of insulating resin layer 6 outside of the outer circumferential portion of semiconductor element 4. Lead frame 2 includes terminal portion 2a that is a terminal portion and stepped portion (inclined portion) 2b.

As shown in FIGS. 11 and 12, projection 13 is provided in insulating resin layer 6 on the outer circumferential portion of semiconductor element 4 for improved insulating properties of the semiconductor device. In the present embodiment, projection 13 is produced in advance in the portion of insulating resin layer 6 which is in contact with the outer circumferential portion of semiconductor element 4, so that the outer circumferential portion that is in contact with semiconductor element 4 mounted on lead frame 2 is thick as shown in FIG. 11, and openings 10 are formed through punching or the like in the electrode portion that forms a circuit layer.

In semiconductor device 300 configured as described above, the upper surfaces of main-circuit conductive layer 7 and control conductive layer 8 are located above the upper surface of terminal portion 2a of lead frame 2, and accordingly, the heat generated in semiconductor element 4 can be efficiently conducted to the outside of sealing resin 9 also from the upper surface side of semiconductor element 4, leading to enhanced cooling efficiency. This can improve the reliability of semiconductor device 300.

Also, main-circuit conductive layer 7 joined to semiconductor element 4 is thicker than control conductive layer 8 as described above, enabling efficient dissipation of the heat from semiconductor element 4 that generates a large amount of heat.

Further, projection 13 is provided in insulating resin layer 6 that is in contact with the outer circumferential portion of semiconductor element 4, leading to improved insulating properties of semiconductor device 300.

Embodiment 4

Embodiment 4 differs from Embodiment 3 in that thermally conductive member 1 used in Embodiment 3 is not provided and sealing resin 9 containing a high-thermal-conductivity filler fills the rear surface side of lead frame 2. In this manner, the rear surface side of lead frame 2 is filled with the sealing resin containing a high-thermal-conductivity filler, leading to improved insulating properties and heat dissipation properties of the semiconductor device. Embodiment 4 is similar to Embodiment 3 in the other respects, and accordingly, detailed description will be omitted.

Also in such a case, the upper surfaces of main-circuit conductive layer 7 and control conductive layer 8 are located above the upper surface of terminal portion 2a of lead frame 2, and accordingly, the heat generated in semiconductor element 4 can be conducted to the outside of sealing resin 9 also from the upper surface side of semiconductor element 4, leading to enhanced cooling efficiency. This can improve the reliability of the semiconductor device.

Figure 13:
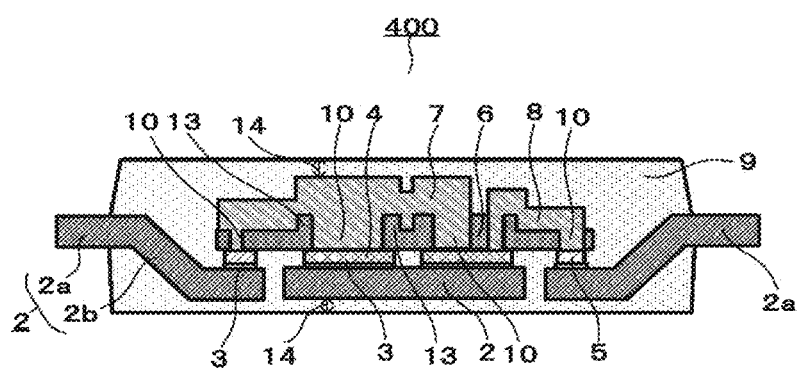
FIG. 13 is a schematic structural sectional view of a semiconductor device in Embodiment 4 of the present invention.

FIG. 13 is a schematic structural sectional view of a semiconductor device in Embodiment 4 of the present invention. With reference to FIG. 13, a semiconductor device 400 includes lead frame 2 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, openings 10 that are first openings, and projection 13 of insulating resin layer 6. Main-circuit conductive layer 7 has a thickness larger than the thickness of control conductive layer 8. Projection 13 is formed in the outer circumferential portion of insulating resin layer 6 which is in contact with semiconductor element 4. Further, lead frame 2 includes terminal portion 2a that is a terminal portion and stepped portion (inclined portion) 2b.

With reference to FIG. 13, sealing resin 9 is formed also on the rear surface side of lead frame 2. This results in a structure in which lead frame 2 is covered with sealing resin 9. A high-thermal-conductivity filler is used for sealing resin 9, and for example, a metallic oxide, such as silica or alumina, or a nitride, such as aluminum nitride or boron nitride, is used. Sealing resin 9 includes a filler containing at least one of the metallic oxide and the nitride.

In the present embodiment, as shown in FIG. 13, sealing resin 9 covers the entirety of the semiconductor device, and accordingly, serves as a resin housing and also serves to secure insulating properties of lead frame 2 and main-circuit conductive layer 7 and dissipate heat from semiconductor element 4. Thus, a distance from the lower surface of sealing resin 9 to the rear surface of lead frame 2, that is, a thickness 14 of sealing resin 9 on the rear surface side of lead frame 2, and a distance from the upper surface of main-circuit conductive layer 7 to the upper surface of sealing resin 9, that is, a thickness 14 of sealing resin 9 above main-circuit conductive layer 7, are desirably 0.1 mm or more and 1.0 mm or less in terms of the heat dissipation properties and insulating properties of the semiconductor device. If thickness 14 is smaller than 0.1 mm, insulating properties cannot be secured. If thickness 14 is greater than 1.0 mm, heat dissipation properties may degrade. Thus, the range of thickness 14 is desirably 0.1 mm or more to 1.0 mm or less.

In semiconductor device 400 configured as described above, the upper surfaces of main-circuit conductive layer 7 and control conductive layer 8 are located above the upper surface of terminal portion 2a of lead frame 2, and accordingly, the heat generated in semiconductor element 4 can be efficiently conducted to the outside of sealing resin 9 also from the upper surface side of semiconductor element 4, leading to enhanced cooling efficiency. This can improve the reliability of semiconductor device 400.

Main-circuit conductive layer 7 joined to semiconductor element 4 is thicker than control conductive layer 8 as described above, enabling efficient dissipation of the heat from semiconductor element 4 that generates a large amount of heat.

Further, projection 13 is provided in insulating resin layer 6 that is in contact with the outer circumferential portion of semiconductor element 4, leading to improved insulation reliability of semiconductor device 400.

The rear surface side of lead frame 2 is also filled with sealing resin 9 containing a high-thermal-conductivity filler, leading to improved insulating properties and heat dissipation properties of semiconductor device 400.

Embodiment 5

Embodiment 5 differs from Embodiment 3 in that circuit member 2 used in Embodiment 3 is replaced with an insulating circuit board 15 and the rear surface side of insulating circuit board 15 is also filled with sealing resin 9. In this manner, insulating circuit board 15 is used to also fill the rear surface side of insulating circuit board 15 with the sealing resin, leading to improved insulating properties and heat dissipation properties of the semiconductor device. Embodiment 5 is similar to Embodiment 3 in the other respects, and accordingly, detailed description will be omitted.

Also in such a case, the upper surfaces of main-circuit conductive layer 7 and control conductive layer 8 are located above the upper surface of a terminal 17 of insulating circuit board 15, and accordingly, the heat generated in semiconductor element 4 can be efficiently conducted to the outside of sealing resin 9 also from the upper surface side of semiconductor element 4, leading to enhanced cooling efficiency. This can improve the reliability of the semiconductor device.

Figure 14:
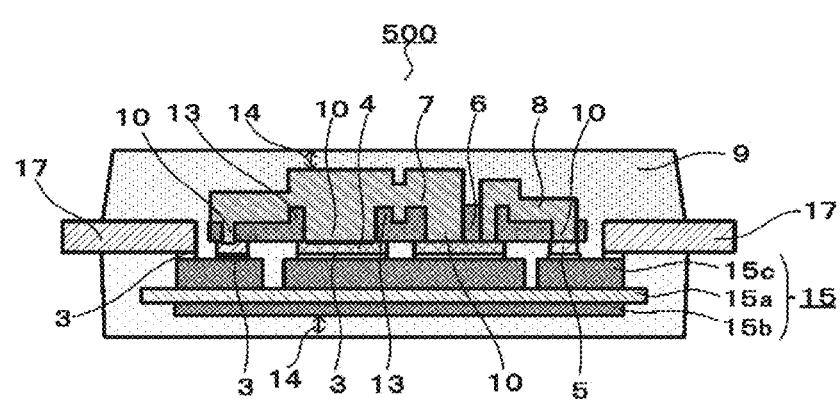
FIG. 14 is a schematic structural sectional view of a semiconductor device in Embodiment 5 of the present invention.

FIG. 14 is a schematic structural sectional view of a semiconductor device in Embodiment 5 of the present invention. With reference to FIG. 14, a semiconductor device 500 includes insulating circuit board 15 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, openings 10 that are first openings, projection 13 of insulating resin layer 6, and terminal 17 that is a terminal portion. Main-circuit conductive layer 7 has a thickness larger than the thickness of control conductive layer 8. Projection 13 is formed around the region of insulating resin layer 6 which is in contact with semiconductor element 4.

Insulating circuit board 15 includes metal layers 15c and 15b on the opposite surfaces (front surface, rear surface) of an insulating layer 15a. A substrate formed of a filler and a resin, such as a plate-shaped printed interconnect board, can be used as insulating circuit board 15, which may be, for example, a substrate in which rolled material of a metal such as copper is attached to the opposite sides of a ceramic of alumina, aluminum nitride, silicon nitride, or the like.

In the present embodiment, as shown in FIG. 14, terminal 17 is joined to metal layer 15c on the front surface of insulating circuit board 15 with solder 3. Thus, in filling with sealing resin 9, terminal 17 is retained between dies for molding with insulating circuit board 15 being isolated from the bottom surface inside the die (front surface of a lower die). Sealing resin 9 comes around the rear surface side of insulating circuit board 15. The portion of terminal 17 which projects into the dies is sealed in sealing resin 9 after sealing with sealing resin 9. The portion of terminal 17 which is retained between the dies projects from inside to outside of sealing resin 9 after being sealed with sealing resin 9. The upper surface of semiconductor element 4 is located on the front surface side of insulating circuit board 15 relative to the upper surface of terminal 17 of insulating circuit board 15. That is to say, the distance from the upper surface of terminal 17 inside sealing resin 9 to the upper surface of sealing resin 9 is set to be less than the distance from the upper surface of semiconductor element 4 to the upper surface of sealing resin 9.

As shown in FIG. 14, sealing resin 9 covers the entirety of semiconductor device 500, and accordingly, serves as a resin housing and also serves to secure the insulating properties of insulating circuit board 15 and main-circuit conductive layer 7 and dissipate heat from semiconductor element 4. Thus, the distance from the lower surface of sealing resin 9 to the rear surface of metal layer 15b of insulating circuit board 15, that is, a thickness 14 of sealing resin 9 on the rear surface side of metal layer 15b and the distance from the upper surface of main-circuit conductive layer 7 to the upper surface of sealing resin 9, that is, thickness 14 of sealing resin 9 above main-circuit conductive layer 7 are desirably 0.1 mm or more and 1.0 mm or less in terms of the heat dissipation properties and insulating properties of the semiconductor device. If thickness 14 is smaller than 0.1 mm, insulating properties cannot be secured. If thickness 14 is greater than 1.0 mm, heat dissipation properties may degrade. Thus, thickness 14 is desirably in the range of 0.1 mm or more to 1.0 mm or less.

Figure 15:
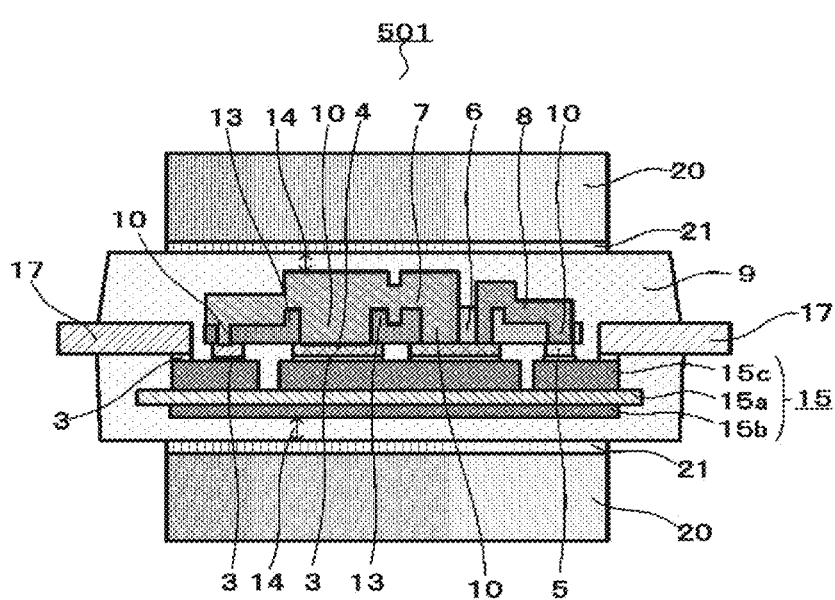
FIG. 15 is a schematic structural sectional view of another semiconductor device in Embodiment 5 of the present invention.

FIG. 15 is a schematic structural sectional view of another semiconductor device in Embodiment 5 of the present invention. With reference to FIG. 15, a semiconductor device 501 includes insulating circuit board 15 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, openings 10 that are first openings, projection 13 of insulating resin layer 6, and terminal 17 that is a terminal portion. Main-circuit conductive layer 7 has a thickness larger than the thickness of control conductive layer 8. Projection 13 is formed around a region of insulating resin layer 6 which is in contact with semiconductor element 4. Semiconductor device 501 further includes a cooler 20 on each of the upper surface and the lower surface thereof with a grease 21 located therebetween.

Cooler 20 is provided in each of the upper surface and the lower surface of the semiconductor device as shown in FIG. 15, leading to improved cooling performance. Cooler 20 can be provided in any one of the upper surface and the lower surface in accordance with required cooling capability.

Figure 16:
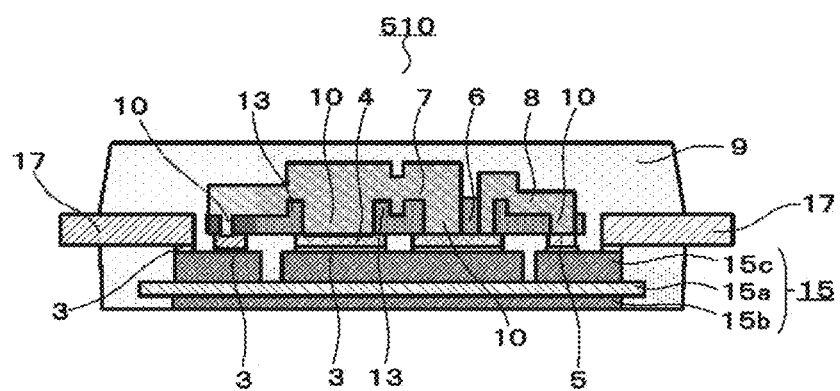
FIG. 16 is a schematic structural sectional view of another semiconductor device in Embodiment 5 of the present invention.

FIG. 16 is a schematic structural sectional view of another semiconductor device in Embodiment 5 of the present invention. With reference to FIG. 16, a semiconductor device 510 includes insulating circuit board 15 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, openings 10 that are first openings, projection 13 of insulating resin layer 6, and terminal 17 that is a terminal portion. Main-circuit conductive layer 7 has a thickness larger than the thickness of control conductive layer 8. Projection 13 is formed around the region of insulating resin layer 6 which is in contact with semiconductor element 4. Further, semiconductor device 510 has a structure in which the rear surface of metal layer 15c on the rear surface of insulating circuit board 15 is exposed from sealing resin 9.

Herein, terminal 17 of insulating circuit board 15 inside sealing resin 9 is arranged above the portion (region) on the front surface (upper surface) of insulating circuit board 15 on which semiconductor element 4 is mounted. Semiconductor element 4 is arranged on the front surface of insulating circuit board 15. The upper surface of semiconductor element 4 is arranged on the front surface side of insulating circuit board 15 relative to the upper surface of terminal 17 of insulating circuit board 15. That is to say, the distance (h1) from the upper surface of terminal 17 of insulating circuit board 15 inside sealing resin 9 to the upper surface of sealing resin 9 is smaller than the distance (h2) from the upper surface of semiconductor element 4 to the upper surface of sealing resin 9. Such an arrangement can improve a withstand voltage between metal layer 15c on the rear surface of the insulating layer of insulating circuit board 15 and terminal 17 of insulating circuit board 15.

The upper surfaces of main-circuit conductive layer 7 and control conductive layer 8 are arranged on the upper surface side of sealing resin 9 relative to the upper surface of terminal 17 of insulating circuit board 15 inside sealing resin 9. Also, the upper surface of terminal 17 of insulating circuit board 15 inside sealing resin 9 is arranged above the upper surface of semiconductor element 4. Thus, the heat generated on the upper surface side of semiconductor element 4 is efficiently conducted to the outside of sealing resin 9 for dissipation, leading to enhanced cooling efficiency. This can improve the reliability of semiconductor device 500, 501, 510. In particular, heat dissipation at a plurality of spots is effective in such a use condition that requires an operation at high temperature.

In semiconductor device 500, 501, 510 configured as described above, the upper surfaces of main-circuit conductive layer 7 and control conductive layer 8 are located above the upper surface of terminal 17 of insulating circuit board 15, and accordingly, the heat generated in semiconductor element 4 can be efficiently conducted to the outside of sealing resin 9 also from the upper surface side of semiconductor element 4, leading to enhanced cooling efficiency. This can improve the reliability of semiconductor device 500, 501, 510.

Main-circuit conductive layer 7 joined to semiconductor element 4 is thicker than control conductive layer 8 as described above, enabling efficient dissipation of the heat from semiconductor element 4 that generates a large amount of heat.

Projection 13 is provided in insulating resin layer 6 that is in contact with the outer circumferential portion of semiconductor element 4, leading to improved insulation reliability of semiconductor device 500, 501, 510.

Embodiment 6

Embodiment 6 differs from Embodiment 5 in that insulating circuit board 15 used in Embodiment 5 has a through-hole 16 provided for improving heat dissipation properties. In this manner, through-hole 16 is provided in insulating circuit board 15, and a copper pillar or the like is inserted into through-hole 16 to connect metal layer 15b and metal layer 15c, leading to enhanced thermal conductivity from metal layer 15c of insulating circuit board 15. Embodiment 6 is similar to Embodiment 5 in the other respects, and accordingly, detailed description will be omitted.

Also in such a case, the upper surfaces of main-circuit conductive layer 7 and control conductive layer 8 are located above the upper surface of terminal 17 of insulating circuit board 15, and accordingly, the heat generated in semiconductor element 4 can be efficiently conducted to the outside of sealing resin 9 also from the upper surface side of semiconductor element 4, leading to enhanced cooling efficiency. Consequently, the reliability of the semiconductor device can be improved.

Figure 17:
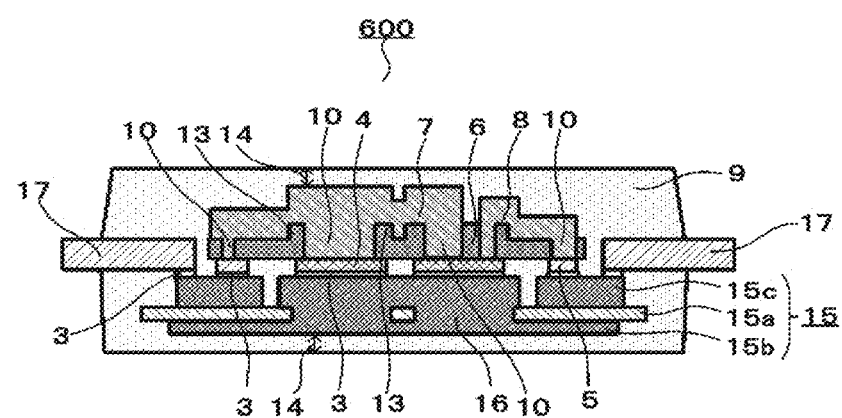
FIG. 17 is a schematic structural sectional view of a semiconductor device in Embodiment 6 of the present invention.

FIG. 17 is a schematic structural sectional view of a semiconductor device in Embodiment 6 of the present invention. With reference to FIG. 17, a semiconductor device 600 includes insulating circuit board 15 that is a circuit member, solder 3 that is a joining member, semiconductor element 4, conductive spacer 5 that is a connecting member, insulating resin layer 6 that is a resin layer, main-circuit conductive layer 7 that is a first conductive layer, control conductive layer 8 that is a second conductive layer, sealing resin 9 that is a sealing member, openings 10 that are first openings, projection 13 of insulating resin layer 6, through-hole 16, and terminal 17 that is a terminal portion. Main-circuit conductive layer 7 has a thickness larger than the thickness of control conductive layer 8. Projection 13 is formed around the region of insulating resin layer 6 which is in contact with semiconductor element 4.

Insulating circuit board 15 includes metal layers 15c and 15b on the opposite surfaces (front surface and rear surface) of insulating layer 15a. Insulating circuit board 15 has through-hole 16 passing through insulating circuit board 15. A copper pillar or the like is inserted into through-hole 16, providing a structure in which metal layer 15c and metal layer 15b are connected.

In the present embodiment, as shown in FIG. 17, terminal 17 is joined to metal layer 15c on the front surface of insulating circuit board 15 with solder 3. Thus, in molding of sealing resin 9, terminal 17 is retained between dies for molding with insulating circuit board 15 being isolated from the bottom surface inside the die (front surface of the lower die). The portion of terminal 17 which projects into the dies is sealed with sealing resin 9, thereby being sealed within sealing resin 9. The portion of terminal 17 which is retained between the dies projects from inside to outside of sealing resin 9 after being sealed with sealing resin 9. The distance from the upper surface of terminal 17 to the upper surface of sealing resin 9 is set to be less than the distance from the upper surface of semiconductor element 4 to the upper surface of sealing resin 9.

As shown in FIG. 17, sealing resin 9 covers the entirety of semiconductor device 600, and accordingly, serves as a resin housing and also serves to secure the insulating properties of insulating circuit board 15 and main-circuit conductive layer 7 and dissipate heat from semiconductor element 4. Thus, the distance from the lower surface of sealing resin 9 to the rear surface of metal layer 15b of insulating circuit board 15, that is, thickness 14 of sealing resin 9 on the rear surface side of metal layer 15b and the distance from the upper surface of main-circuit conductive layer 7 to the upper surface of sealing resin 9, that is, thickness 14 of sealing resin 9 above main-circuit conductive layer 7 are desirably 0.1 mm or more and 1.0 mm or less in terms of the heat dissipation properties and insulating properties of the semiconductor device. If thickness 14 is smaller than 0.1 mm, insulating properties cannot be secured. If thickness 14 is greater than 1.0 mm, heat dissipation properties may degrade. Thus, thickness 14 is desirably within the range of 0.1 mm or more to 1.0 mm or less.

In semiconductor device 600 configured as described above, the upper surfaces of main-circuit conductive layer 7 and control conductive layer 8 are located above the upper surface of terminal 17 of insulating circuit board 15, and accordingly, the heat generated in semiconductor element 4 can be efficiently conducted to the outside of sealing resin 9 also from the upper surface side of semiconductor element 4, leading to enhanced cooling efficiency. This can improve the reliability of semiconductor device 600.

Main-circuit conductive layer 7 joined to semiconductor element 4 is thicker than control conductive layer 8 as described above, enabling efficient dissipation of the heat from semiconductor element 4 that generates a large amount of heat.

Projection 13 is provided in insulating resin layer 6 that is in contact with the outer circumferential portion of semiconductor element 4, leading to improved insulation reliability of semiconductor device 600.

Embodiment 7

Embodiment 7 differs from Embodiment 1 in that conductive spacer 5 for connection of lead frame 2 with main-circuit conductive layer 7 and control conductive layer 8, used in Embodiment 1, is replaced with a protrusion 2c integrally formed with lead frame 2. Protrusion 2c is provided in lead frame 2 to connect lead frame 2 with main-circuit conductive layer 7 and control conductive layer 8 using protrusion 2c as described above, thus preventing a poor connection of lead frame 2 with main-circuit conductive layer 7 and control conductive layer 8. Embodiment 7 is similar to Embodiment 1 in the other respects, and accordingly, detailed description will be omitted.

Figure 18:
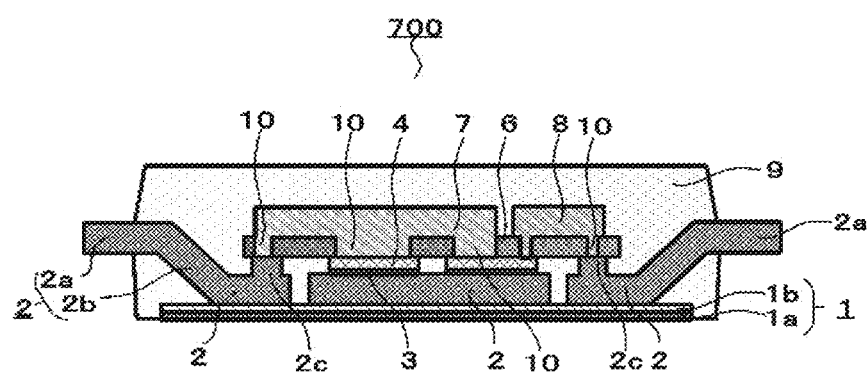
FIG. 18 is a schematic structural sectional view of a semiconductor device in Embodiment 7 of the present invention.

FIG. 18 is a schematic structural sectional view of a semiconductor device in Embodiment 7 of the present invention.

With reference to the figure, a semiconductor device 700 includes thermally conductive member 1, lead frame 2 that is a circuit member, solder 3 that is a joining member, semiconductor element 4, conductive spacer 5 that is a connecting member, insulating resin layer 6 that is a resin layer, main-circuit conductive layer 7 that is a conductive layer (first conductive layer), control conductive layer 8 that is a conductive layer (second conductive layer), and sealing resin 9 that is a sealing member.

Lead frame 2 includes terminal portion 2a that is a terminal portion and stepped portion (inclined portion) 2b and also includes protrusion 2c. Protrusion 2c is used for electrically, thermally connecting lead frame 2 with main-circuit conductive layer 7 and control conductive layer 8. In sectional view and in plan view, the area of protrusion 2c is larger than the areas of opening 10 at portions of insulating resin layer 6 at which lead frame 2 is connected with main-circuit conductive layer 7 and control conductive layer 8. This can prevent a poor connection of lead frame 2 with main-circuit conductive layer 7 and control conductive layer 8.

Further, protrusion 2c can be formed by forging or the like in a step preceding or following the production by punching of lead frame 2. Alternatively, protrusion 2c may be formed by producing lead frame 2 with part thereof having a large thickness, and then reducing the thickness of the portion other than protrusion 2 through cutting or the like. In production of protrusion 2c through forging or cutting, lead frame 2 having a small thickness cannot withstand processing through forging or cutting, which may cause a breakage or crack. The thickness of lead frame 2 is thus desirably 0.3 mm or more.

In semiconductor device 700 configured as described above, the upper surfaces of main-circuit conductive layer 7 and control conductive layer 8 are located above the upper surface of terminal portion 2a of lead frame 2, and accordingly, the heat generated in semiconductor element 4 can be efficiently conducted to the outside of sealing resin 9 also from the upper surface side of semiconductor element 4, leading to enhanced cooling efficiency. Consequently, the reliability of semiconductor device 700 can be improved.

Protrusion 2c is provided integrally with lead frame 2 and make the area of protrusion 2c larger than the areas of opening 10 at portions of insulating resin layer 6 at which lead frame 2 is connected with main-circuit conductive layer 7 and control conductive layer 8, thus preventing a poor connection of lead frame 2 with main-circuit conductive layer 7 and control conductive layer 8.

Embodiment 8

In Embodiment 8, the semiconductor device according to any one of Embodiments 1 to 7 described above is used for a power converter. Although the present invention is not limited to a specific power converter, the following will describe a case in which the present invention is applied to a three-phase inverter as Embodiment 8.

Figure 19:
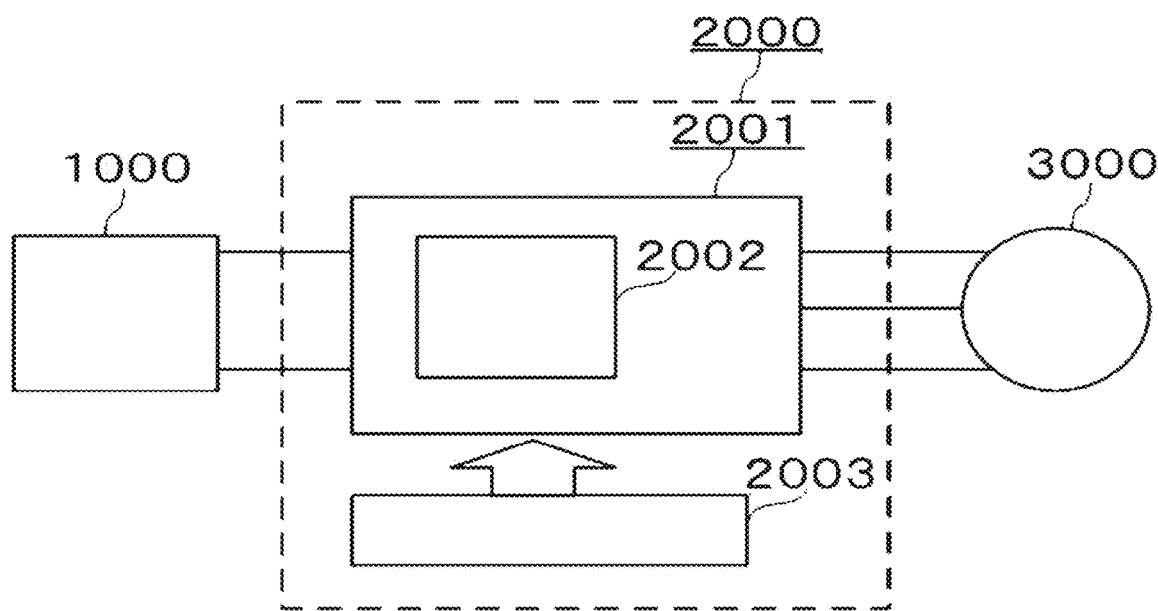
FIG. 19 is a block diagram showing a configuration of a power conversion system in which a power converter in Embodiment 8 of the present invention is used.

FIG. 19 is a block diagram showing a configuration of a power conversion system in which the power converter in Embodiment 8 of the present invention is used.

The power conversion system shown in FIG. 19 includes a power source 1000, a power converter 2000, and a load 3000. Power source 1000 is a DC power source and supplies DC power to power converter 2000. Power source 1000 can be implemented variously, which may be, for example, a DC system, a solar battery, or a storage battery, or may be a rectifier circuit, an AC/DC converter, or the like connected to an AC system. Alternatively, power source 1000 may be implemented as a DC/DC converter that converts DC power output from the DC system to predetermined power.

Power converter 2000 is a three-phase inverter connected between power source 1000 and load 3000, and converts DC power supplied from power source 1000 to AC power and supplies the AC power to load 3000. As shown in FIG. 19, power converter 2000 includes a main conversion circuit 2001, which converts DC power supplied from power source 1000 to AC power and outputs the AC power, and a control circuit 2003, which outputs a control signal for controlling main conversion circuit 2001 to main conversion circuit 2001.

Load 3000 is a three-phase electric motor driven by the AC power supplied from power converter 2000. Load 3000 is not limited to a specific application but is an electric motor mounted in various electrical equipment and is used as, for example, an electric motor for hybrid vehicles, electric vehicles, railway vehicles, elevators, air-conditioning equipment, or the like.

Power converter 2000 will be described below in detail. Main conversion circuit 2001 includes a switching element and a freewheeling diode (which are not shown) built in semiconductor device 2002, and upon switching of the switching element, convers DC power supplied from power source 1000 to AC power and supplies the AC power to load 3000. Although the specific circuit configuration of main conversion circuit 2001 is of various types, main conversion circuit 2001 according to the present embodiment is a two-level, three-phase full-bridge circuit and can be formed of six switching elements and six freewheeling diodes each connected in antiparallel with a corresponding one of the six switching elements. Main conversion circuit 2001 includes semiconductor device 2002 according to any one of Embodiments 1 to 5 described above which includes internal switching elements and internal freewheeling diodes. The six switching elements are connected in series every two switching elements to constitute upper and lower arms, and each of the upper arms and a corresponding one of the lower arms constitute one phase (U-phase, V-phase, W-phase) of the full-bridge circuit. The output terminals of the respective upper and lower arms, that is, three output terminals of main conversion circuit 2001 are connected to load 3000.

Main conversion circuit 2001 also includes a drive circuit (not shown) that drives each switching element. The drive circuit may be built in semiconductor device 2002, or in another configuration, the drive circuit may be provided separately from semiconductor device 2002. The drive circuit generates a drive signal for driving the switching element of main conversion circuit 2001 and supplies the drive signal to a control electrode of the switching element of main conversion circuit 2001. Specifically, the drive circuit outputs a drive signal for turning on the switching element and a drive signal for turning off the switching element to the control electrode of each switching element in accordance with control signal from control circuit 2003, which will be described below. When the switching element is maintained in the on state, the drive signal is a voltage signal (ON signal) not less than a threshold voltage of the switching element, and when the switching element is maintained in the off state, the drive signal is a voltage signal (OFF signal) not more than the threshold voltage of the switching element.

Control circuit 2003 controls the switching element of main conversion circuit 2001 such that desired electric power is supplied to load 3000. Specifically, control circuit 2003 calculates a time (ON time) at which each switching element of main conversion circuit 2001 is to be turned on based on the electric power to be supplied to load 3000. For example, control circuit 2003 can control main conversion circuit 2001 through PWM control in which the ON time of the switching element is modulated in accordance with a voltage to be output. Also, control circuit 2003 outputs a control command (control signal) to a drive circuit of main conversion circuit 2001 so as to output an ON signal to the switching element to be turned on and output an OFF signal to the switching element to be turned off at each point in time. The drive circuit outputs the ON signal or OFF signal as a drive signal to the control electrode of each switching element in accordance with the control signal.

In the power converter according to Embodiment 8 configured as described above, the semiconductor device according to any one of Embodiments 1 to 7 is used as semiconductor device 2002 of main conversion circuit 2001, leading to improved reliability.

Although the present embodiment has described an example in which the present invention is applied to a two-level, three-phase inverter, the present invention is not limited thereto and is applicable to various power converters. Although the two-level power converter is used in the present embodiment, a three-level or multi-level power converter may be used, or the present invention may be applied to a single-phase inverter when electric power is supplied to a single-phase load. When electric power is supplied to a DC load or the like, the present invention is also applicable to a DC/DC converter, an AC/DC converter, or the like.

A power converter to which the present invention is applied is not limited to a case in which the load described above is an electric motor. Such a power converter can be used as a power source apparatus or the like of, for example, an electric discharge machine, a laser beam machine, an induction heat cooker, or a non-contact feeding system, and further as a power conditioner of a solar power generation system, a power storage system, or the like.

It is to be understood that the embodiments disclosed herein are presented for the purpose of illustration and non-restrictive in every respect. It is therefore intended that the scope of the present invention is defined by claims, not only by the embodiments described above, and encompasses all modifications and variations equivalent in meaning and scope to the claims. Moreover, the plurality of components disclosed in the above embodiments can be combined as appropriate to form the invention.

REFERENCE SIGNS LIST 1 thermally conductive member, 1a metal foil, 1b insulating sheet, 2 lead frame, 2a terminal portion, 2b stepped portion, 2c protrusion, 3 solder, 4 semiconductor element, 5 conductive spacer, 6 insulating resin layer, 7 main-circuit conductive layer, 8 control conductive layer, 9 sealing resin, 10, 11 opening, 12 flow direction, 13 projection, 14 resin thickness, 15 insulating circuit board, 16 through-hole, 17 terminal, 100, 200, 300, 400, 500, 501, 510, 600, 700, 2002 semiconductor device, 1000 power source, 2000 power converter, 2001 main conversion circuit, 2003 control circuit, 3000 load.

The invention claimed is:
1. A semiconductor device comprising:
a circuit member including a front surface and a rear surface and including a planar portion;
a terminal portion formed above the front surface of the planar portion of the circuit member and parallel to the planar portion;
a semiconductor element including an upper surface located below an upper surface of the terminal portion, the semiconductor element being formed on the front surface of the planar portion of the circuit member;
a resin layer arranged on the semiconductor element and having a plurality of first openings through which the semiconductor element is exposed;
a conductive layer arranged on the resin layer, having an upper surface located above the upper surface of the terminal portion, and joined to the semiconductor element through the plurality of first openings; and
a sealing member including an upper surface parallel to the planar portion and integrally sealing the circuit member, the semiconductor element, the resin layer, the conductive layer, and part of the terminal portion.
2. The semiconductor device according to claim 1, comprising a connecting member on the planar portion of the circuit member on which the semiconductor element is arranged, the connecting member being flush with the semiconductor element, being exposed through the plurality of first openings through which the semiconductor element is not exposed, and being in contact with the conductive layer.
3. The semiconductor device according to claim 1, wherein the resin layer has a second opening being open while including a region other than a region on the front surface of the circuit member in which the semiconductor element is arranged in plan view, the second opening being filled with the sealing member.

4. The semiconductor device according to claim 1, wherein the resin layer has a larger thickness on an outer circumferential portion of the semiconductor element than outside of the outer circumferential portion of the semiconductor element.

5. The semiconductor device according to claim 1, wherein the circuit member comprises a lead frame.

6. The semiconductor device according to claim 1, wherein the circuit member comprises an insulating circuit board including an insulating layer and a metal layer located on each of a front surface and a rear surface of the insulating layer.

7. The semiconductor device according to claim 5, wherein the connecting member is integrally provided with the circuit member.

8. The semiconductor device according to claim 1, wherein
the conductive layer includes
a first conductive layer joined to a main electrode of the semiconductor element, and
a second conductive layer joined to a control electrode of the semiconductor element, and
the first conductive layer has a thickness larger than a thickness of the second conductive layer.

9. The semiconductor device according to claim 5, wherein
a rear surface of the circuit member is provided with a thermally conductive member, and
a lower surface of the thermally conductive member is exposed from the sealing member.

10. The semiconductor device according to claim 8, wherein the sealing member contains a filler including at least one of a metallic oxide and a nitride.

11. The semiconductor device according to claim 10, wherein a distance from the upper surface of the sealing member to an upper surface of the first conductive layer and a distance from a lower surface of the sealing member to the rear surface of the circuit member are 0.1 mm or more and 1 mm or less.

12. The semiconductor device according to claim 6, wherein the insulating circuit board has a through-hole through which the insulating layer electrically connects a metal layer on the front surface of the insulating layer to a metal layer on the rear surface of the insulating layer.

13. The semiconductor device according to claim 1, comprising a cooler on at least any one of the upper surface and a lower surface of the sealing member.

14. A power converter comprising:
a semiconductor device according to claim 1;
a main conversion circuit to convert supplied electric power and output the electric power; and
a control circuit to output a control signal for controlling the main conversion circuit to the main conversion circuit.

* * * * *